United States Patent [19]

McKenzie, III et al.

[11] Patent Number: 5,779,366
[45] Date of Patent: Jul. 14, 1998

[54] WIRE MANAGEMENT BAG

[75] Inventors: Clifton K. McKenzie, III; Kathy L. McKenzie; Michael B. Barringer, all of Bainbridge Island, Wash.

[73] Assignee: Watson Furniture Systems, Bainbridge Island, Wash.

[21] Appl. No.: 555,101

[22] Filed: Nov. 8, 1995

[51] Int. Cl.⁶ .................................................. B65D 33/14
[52] U.S. Cl. ..................... 383/22; 383/34; 383/38; 383/41; 383/66; 383/103; 206/702
[58] Field of Search ..................... 206/388, 702; 383/33, 34, 34.1, 22, 24, 100, 103, 41, 66, 43, 38, 23; 174/135; 150/120, 121, 112; 229/67.1, 67.2, 67.3, 67.4

[56] References Cited

U.S. PATENT DOCUMENTS

| | | | |
|---|---|---|---|
| 1,291,914 | 1/1919 | Kelley | 383/24 X |
| 1,977,774 | 10/1934 | Osborne | 383/34 X |
| 1,997,941 | 4/1935 | McGiff et al. | 383/34 |
| 2,106,405 | 1/1938 | Havemeyer | 383/41 |
| 2,557,280 | 6/1951 | Hahn . | |
| 2,689,594 | 9/1954 | Wendt | 383/103 X |
| 2,763,707 | 9/1956 | Soderberg | 206/702 X |
| 2,815,785 | 12/1957 | Vail | 383/23 X |
| 3,173,465 | 3/1965 | Pastini . | |
| 3,326,258 | 6/1967 | Stucker | 383/43 X |
| 4,434,829 | 3/1984 | Barnard . | |
| 4,548,375 | 10/1985 | Moss | 383/22 X |
| 4,590,610 | 5/1986 | Rhyne . | |
| 4,662,517 | 5/1987 | Wirth . | |
| 4,694,503 | 9/1987 | Hydorn . | |
| 4,811,768 | 3/1989 | Williams | 150/108 X |
| 4,893,745 | 1/1990 | Weber et al. | 229/67.2 |
| 4,972,981 | 11/1990 | Gex | 224/645 |
| 4,979,614 | 12/1990 | Ruhaut | 206/702 |
| 4,981,110 | 1/1991 | Llewellyn | 224/264 X |
| 5,031,733 | 7/1991 | Chang . | |
| 5,061,086 | 10/1991 | Vallerga . | |
| 5,302,029 | 4/1994 | Weber et al. . | |
| 5,379,810 | 1/1995 | Marino | 383/103 X |
| 5,407,111 | 4/1995 | Lanouette et al. . | |
| 5,439,109 | 8/1995 | McBride | 206/388 |

FOREIGN PATENT DOCUMENTS 2061050  8/1993  Canada ............................. 383/24

*Primary Examiner*—Jes F. Pascua
*Attorney, Agent, or Firm*—Christensen O'Connor Johnson & Kindness PLLC

[57] ABSTRACT

A wire management bag (18) including a body (20) having closure mechanism, and furniture attachment system, is provided. The body (20) further includes an open top (38) and at least one opening (29) therein for egress of wires destined for other electronic or electrical equipment. The closure mechanism is preferably a portfolio-type hinged mechanism (54). The furniture attachment system preferably includes first and second hanging straps (36), (40). One end (42) of each hanging strap is attached to the body, other end (44) is hung from furniture-attached hooks (48) via a D-ring (46) in each strap. In a first alternative embodiment, the body (20) of the present invention includes one or more dividers therein for permitting the separation of various types of wiring. In a second alternative embodiment, the body includes one or more venting holes (60), (62) for allowing maximum heat dissipation. In operation, the hanging straps (36), (40) are hung from the hooks (48), and the body (20) is allowed to hang downwardly. Next, electrical wires are placed into the bag (18) via its open top (38). Wiring intended to connect to other equipment is pulled through the at least one opening (29). The closure mechanism is operated to close the body top (38).

22 Claims, 2 Drawing Sheets

WIRE MANAGEMENT BAG

FIELD OF THE INVENTION

The present invention relates to apparatus of organization, and more particularly, to an efficient device for organizing electrical and electronic wiring.

BACKGROUND OF THE INVENTION

It has become common for individuals and companies to own a number of electronic devices, such as computers, printers, stereos, speakers, etc. Most of these devices include electrical wiring that extends from their back sides to either other electronic equipment or to a power source. As the number of available electronic devices has increased, so too has the number of wires surrounding a user's overall system. Most people simply gather the wires into a pile and attempt to hide the pile behind a piece of furniture.

Having a large jumble of wires is disadvantageous for various reasons. Obviously, a large jumble of wires looks unsightly and can become annoyingly tangled. A large pile of wires is also difficult to keep clean, as is the surrounding floor. The situation typically results in increased accumulation of dirt and dust at the floor location of the wires. Where a pathway exists around the pile of wires, there is a danger that a person may trip on the wires as he or she walks past. The wires are also a hindrance to the user who may need the space for his or her feet or legs. The placement of the wires at the back of a table or desk may also cause harm to the wires if they are kicked or distorted by the user's feet. Tangled or jumbled wires can be difficult to trace, such as if an adjustment or change for a connection is desired, and can interfere with easy routing of new or replacement wires.

SUMMARY OF THE INVENTION

The present invention provides an apparatus for organizing the electrical wiring accompanying current electronic equipment. Such an apparatus lifts all wires off the floor and is easy to use with many types of tables, desks, or other equipment-holding furniture. The apparatus is strong and large enough to store large cabling and tidily holds all wires out of view. The apparatus also allows the user to easily connect any wire to a peripheral device or a power supply source. Such an apparatus provides an additional modesty function for those users having a table or desk with an open back.

In the preferred embodiment, the apparatus in accordance with the present invention is in the form of a wire management bag that includes a folded canvas body having closure mechanism, and a furniture attachment system. The bag is attached to a desk, table, or the like, for use in holding all types of electronic wires, computer cables, etc. The body includes or forms at least one opening to allow egress of wires and cables destined for other electronic equipment, as needed.

In accordance with other aspects of the preferred embodiment, the body is formed by folding a substantially square piece of canvas in half, a bottom being defined along the fold line. An open top is formed between the top edges, opposite the folded bottom.

In accordance with further aspects of the preferred embodiment, the closure mechanism functions to keep the wires within the body and to hide them from view. The closure mechanism may be selected from a number of closures, a portfolio-type spring hinge mechanism being preferred.

In accordance with yet other aspects of the preferred embodiment, the furniture attachment system serves to attach the body to a piece of furniture so that the wires are held above the floor. The furniture attachment system may be selected from a number of known attachment arrangements, the preferred furniture attachment including first and second hanging straps. One end of each strap is attached to the body, and the other end includes a D-ring that may be hung from a furniture-attached hook.

In a first alternative embodiment, the body includes one or more dividers for permitting the separation of different types of wiring.

In a second alternative embodiment, the body includes one or more venting holes for allowing maximum heat dissipation.

The preferred wire management bag is operated by first attaching it to the desired piece of furniture. Next, electrical wires (e.g., computer wires, stereo wires, video equipment wires, etc.) are inserted into the bag through the open top. Wiring intended to connect to other equipment is pulled through the side or end opening, leaving the excess wiring in the bag. The closure is operated to close the top. Alternatively, wiring may be inserted into the bag through the side opening, while exiting from the open top.

Thus, a would-be jumble of wires is held off of the floor and out of sight. This makes it easier to clean the surrounding floor areas, as well as safer for passersby and users alike. If the wire management bag is hung from an exposed open-backed desk, the bag additionally serves as a modesty panel for the person sitting at the desk by at least partially covering the back area of the desk.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

In describing the device of the present invention, reference is made to its application to computer wires. However, it should be understood that the device of the present invention is not intended to be limited for use with only computer wires. The device may be used with electrical wiring from various types of electronic and electrical equipment in the same manner as described below with respect to computer wiring. Therefore, although the present invention was developed for, and is described in connection with, computer wiring, it is to be clearly understood that the present invention may also find application in other areas.

Figure 1:
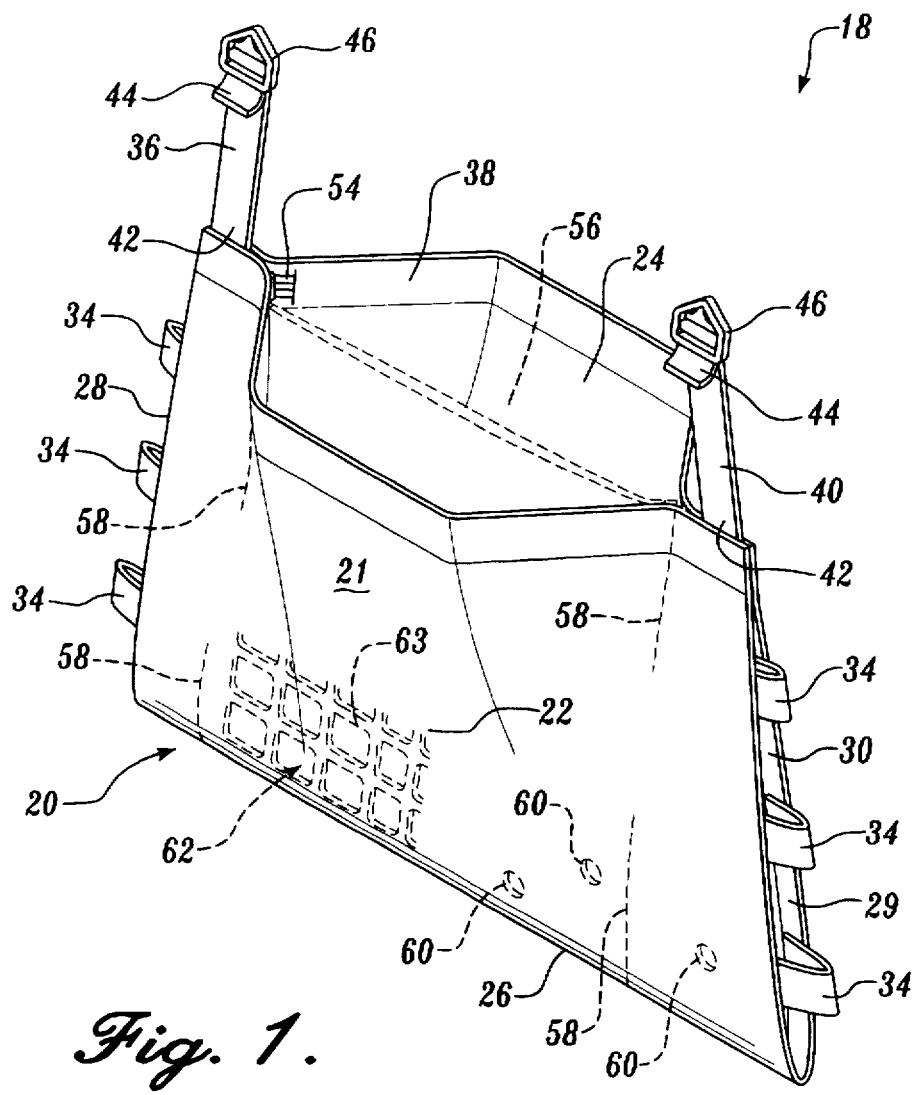
FIG. 1 is a top perspective of a wire management bag in accordance with the present invention.

With reference to FIG. 1, the preferred wire management bag 18 of the present invention includes a body 20 having a front panel 22, a back panel 24, a closed bottom 26, an open top 38, a first end 28, and a second end 30. The body 20 is formed by folding a substantially square sheet 21 of flexible but dimensionally stable material in half, the bottom 26 being defined by the fold line. The preferred resulting body 20 is therefore rectangular in shape—wider than it is tall. The body 20 is sized to adequately accommodate the expected number of wires for the intended application. A canvas sheet roughly 30-inches by 30-inches has been found to work well for the body. Of course, other suitable materials and sizes may be used to form the body.

The closed bottom 26 may optionally be formed by using one of a number of different methods. For example, horizontal seams may be sewn along overlapping bottom margins of rectangular front and back panels. Also, the closed bottom may be reinforced by inserting a flat rigid member in the bottom of the body (or small, round metal rods, etc.) in order to create an elongate channel therein. Such a channel is especially useful in keeping the bottom of the body from bunching up in sections. Even though formation of a reinforced bottom 26 is not actually necessary to the present invention, it does add to a tidy appearance of the bag during its use. Likewise, metal stays may be incorporated into any portion of the bag (e.g., the bottom, the front panel, the back panel, etc.) to provide additional rigidity.

The first and second ends 28, 30 of the body are formed by joining adjacent upright side edges of the front and back panels. At least one of the ends includes an opening 29 for egress of wires destined for other electronic or electrical equipment, e.g., peripherals, power sources, surge protectors, etc. The opening 29 may be formed in the front or back panel 22 or 24 if such a location would be more advantageous for a particular application. Preferably, however, the opening 29 is through a lower end location. It is advantageous for a wire management bag formed in accordance with the present invention to include some lower opening in the bag to allow one or more wires to easily extend to a distant object without tangling with the wire segments protruding through the top.

The first and second ends 28, 30 may be formed in a variety of ways. In the preferred embodiment shown in FIGS. 1 and 2, the ends are formed by connecting the canvas sheet side edges using a number of horizontal flexible straps 34. Each strap is sewn at one end to the back panel 24 and at its other end to the front panel 22. The use of straps not only helps to define the bag's ends, but also provides multiple vertically spaced openings between the straps 34 through which the wires may be egressed. The preferred number of straps is two or three per side, since using at least two straps provides better dimensional stability of the overall bag, while using three still allows for easy egress of wires therefrom.

Other methods may be used to form the ends 28, 30. What is important is that the overall bag 18 design be capable of holding a multitude of wires and cables in a tidy fashion. Example designs for joining the edges include using hook and pile fasteners, buttons, snaps, buckles, zippers, seams, glue, etc. Likewise, one of various methods may be used to form the one or more openings 29 in the bag 18, including simply cutting a hole through the material of the body.

Figure 2:
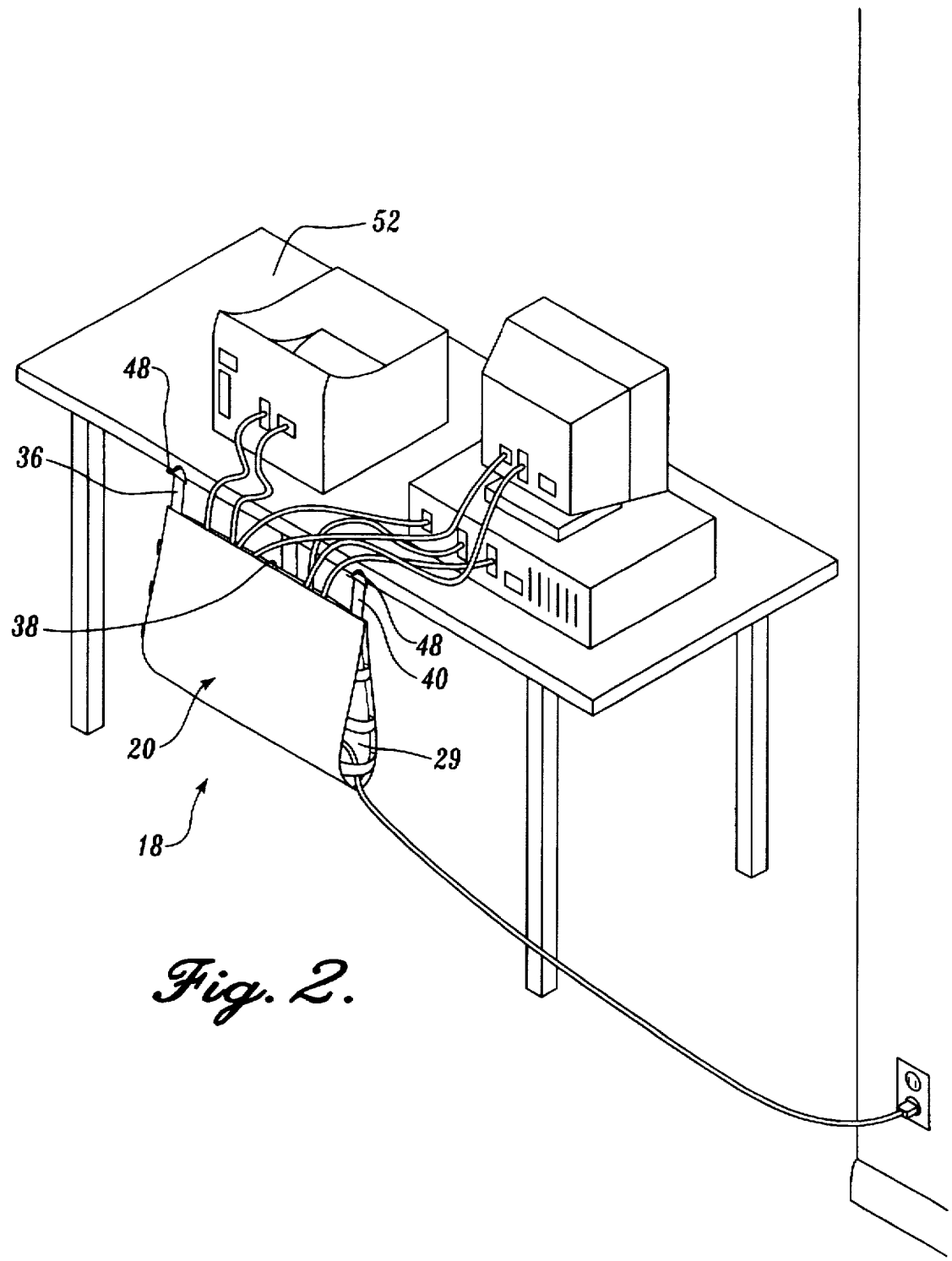
FIG. 2 is a top perspective of the wire management bag of FIG. 1, as installed on an open-back desk.

Some closure mechanism is preferably provided to normally bias the top edges of the front and back panels together. As previously described, the top 38 is open to allow wires to be placed into the body 20. The closure mechanism functions to keep the wires within the body 20 and to hide the mass of wires from view. The preferred closure mechanism shown in FIGS. 1 and 2 is a portfolio-type spring hinge mechanism 54 which includes sections of stiff strips resiliently joined together so as to be manually moveable from closed positions in which the top edges of the front and back panels are linear and spring biased together, and open positions in which the central portions of the top edges are spread apart.

Other methods of closure are possible, including using hook and pile fasteners, snaps, buttons, spring-assisted closures, drawstrings, fold-over flaps, ties, etc. Nevertheless, the portfolio-type hinged mechanism is preferred, because it can be easily opened and remain open without further assistance. A user may load the bag 18 with wires without having to simultaneously hold the top open. The portfolio-type hinged mechanism is also preferred because, once shut, it tends to remain shut even though the front and back panels 22, 24 are being urged apart by the coiled wires inside of the body 20.

The furniture attachment system is located near the top 38, and functions to attach the body to a piece of furniture 38, so that the bag and its wires are held off the floor. The furniture attachment shown in FIGS. 1 and 2 includes first and second hanging straps 36, 40. One end 42 of each strap is sewn at a top corner portion of the body. The other end 44 of each strap includes a D-ring 46 that allows the straps to be hung from furniture-attached hooks 48 (FIG. 2). The optimal location for the hooks 48 is at the back of a table or desktop 52, either along the back vertical edge or on the table underside. The hanging strap D-ring is of a known type that is preferably capable of allowing the hanging strap to be adjusted in vertical height. The furniture attachment may include any one of a number of other known length adjustment components (e.g., buckles) in order to increase the user's ability to customize the vertical placement of the bag.

Other attachment methods may be used instead of straps 36, 40, D-rings 46, and hooks 48, including: straps with eyelets; screws or other mechanical fastening devices; straps and furniture attaching clamps having integrated hooks; plastic or metal snap connectors, such as by having a male portion located on the body and a female portion located on the piece of furniture; a rigid plastic hanger attached to the body and hung from a provided support bar that is attached to a piece of furniture; etc. Additionally, the bag could be attached directly to a specific piece of electronic equipment instead of to a piece of furniture. For example, screws may be placed in the back face of a desktop hard drive to receive the strap D-rings.

In a first alternative embodiment, the body of the present invention includes one or more dividers or partitions (shown diagrammatically in broken lines 56 in FIG. 1) therein for permitting the separation of different types of wiring. For example, data carrying wires may be separated from power supply wires; or stereo equipment wires may be separated from computer equipment wires; and so on. For applications having a significant number of wires, this alternative embodiment is particularly helpful in organizing the mass of wires.

The divider arrangement is most easily formed by sewing a piece of canvas to the inside surfaces of the body front and back panels to define the areas to be separated. A seam is indicated in FIG. 1 by number 58. Such a partition may be formed parallel to the front and back panels as shown in FIG. 1, or transverse to the front and back panels, or otherwise. Another method of forming this divider arrangement is to attach two bodies to each other, where a first body back panel is sewn to a second body front panel, each body having its own openings and closure mechanism.

In a second alternative embodiment, the body includes one or more venting holes for allowing wire heat dissipation. In FIG. 1, a representative configuration is provided that includes a number of circular venting holes 60 shown in phantom. These holes may be placed at various locations to promote the escape of heat from the body. Also shown in FIG. 1 is a second representative configuration that includes a webbed panel 62 used to form a portion of the body in lieu of canvas material. The webbed panel 62 also allows heat to escape from the inside of the bag via the open areas between each web member 63. It is preferable that the entire body 20 not be comprised of such webbed material, though, due to the unsightly possibility of wires inadvertently poking through the webbing. Additionally, the present invention encompasses using a heat resistant (or retardent) material in forming the body, or in lining a portion of the inside of the body.

In operation, the body is hung from a piece of furniture. In FIG. 2, the first and second hanging straps 36, 40 are attached to the furniture-mounted hooks 48 via the strap D-rings 46. Next, electrical wires (e.g., computer wires, stereo wires, video equipment wires, etc.) are inserted into the bag 18 through the top opening 38. Wiring intended to connect to other equipment is pulled through an end opening 29, while leaving the excess wiring in the bag. The closure mechanism is operated to close the top. Alternatively, the open top 38 may be used for both inserting and egressing wires, or wires may be inserted via the opening 29 and egressed via the open top 38.

In this way, the present invention wire management bag 18 neatly holds a would-be jumble of wires off the floor and out of sight. This makes it easier to keep the wires and the floor area clean, as well as safer for passersby and users alike. If the wire management bag 18 is hung from an open-backed desk, the bag additionally serves as a modesty panel for the person sitting at the desk.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A wire management bag for attaching to a piece of furniture or to a piece of electronic equipment, the bag for organizing electrical wires that accompany electronic equipment, the bag comprising:
    (a) a body into which the wires may be placed via an open top in the body, the body including a closure mechanism for retaining the wires in the bag; and
    (b) a furniture attachment system adapted for interconnection between the body and at least one of the piece of furniture and the piece of electronic equipment;
    wherein the closure mechanism includes a portfolio-type hinge mechanism having rigid strips joined together in a spring biased relation; and
    wherein the body includes a front panel having opposite side ends, a back panel having opposite side ends positioned adjacent to the opposite side ends of the front panel, the panels being connected to each other with at least one of the panel side ends being left open to form a wire exit opening, and at least one strap attached to and extending between the open panel side ends.

2. A wire management bag according to claim 1, wherein the body further includes at least one heat dissipating vent opening separate and distinct from the open top and the end opening.

3. A wire management bag for attaching to a piece of furniture or to a piece of electronic equipment, the bag for organizing electrical wires that accompany electronic equipment, the bag comprising:
    (a) a body into which the wires may be placed via an open top in the body, the body including a closure mechanism for retaining the wires in the bag; and
    (b) a furniture attachment system adapted for interconnection between the body and at least one of the piece of furniture and the piece of electronic equipment;
    wherein the closure mechanism includes a portfolio-type hinge mechanism having rigid strips joined together in a spring biased relation; and
    wherein the furniture attachment system includes first and second hanging straps, one end of each strap being attached to the body and the other end of each strap including at least one of a ring and a hook which may be used to hang the bag.

4. A wire management bag for attaching to a piece of furniture or to a piece of electronic equipment, the bag for organizing electrical wires that accompany electronic equipment, the bag comprising:
    (a) a body into which the wires may be placed via an open top in the body, the body including a closure mechanism for retaining the wires in the bag; and
    (b) a furniture attachment system adapted for interconnection between the body and at least one of the piece of furniture and the piece of electronic equipment;
    wherein the closure mechanism includes a portfolio-type hinge mechanism having rigid strips joined together in a spring biased relation; and
    wherein the body includes at least one partition therein to divide the body into separate compartments and allow separation and organization of different types of wires.

5. A wire management bag for attaching to a piece of furniture or to a piece of electronic equipment, the bag for organizing electrical wires that accompany electronic equipment, the bag comprising:
    (a) a body into which the wires may be placed via an open top in the body, the body including a closure mechanism for retaining the wires in the bag; and
    (b) a furniture attachment system adapted for interconnection between the body and at least one of the piece of furniture and the piece of electronic equipment;
    wherein the closure mechanism includes a portfolio-type hinge mechanism having rigid strips joined together in a spring biased relation; and
    wherein the body further includes at least one heat dissipating vent opening separate and distinct from the open top.

6. A wire management bag for use in storing electrical wires that accompany electronic equipment, the bag being adapted for attaching to a piece of furniture or to the electronic equipment, the bag comprising:
    (a) a body having an open top and at least one wire exit opening in the body;
    wherein the body includes front and back panels each having side ends, the panels being connected to each other with at least one of the panel side ends being left open to form the at least one wire exit opening in the body; and
    (b) a furniture attachment system adapted for interconnection between the body and the furniture or equipment;
    wherein the body further includes a closure mechanism for the open top to retain the wires in the bag.

7. A wire management bag according to claim 6, wherein the closure mechanism includes a portfolio-type hinge mechanism having rigid strips joined together in a spring biased relation.

8. A wire management bag for use in storing electrical wires that accompany electronic equipment, the bag being adapted for attaching to a piece of furniture or to the electronic equipment, the bag comprising:

(a) a body having an open top and at least one wire exit opening in the body;

wherein the body includes front and back panels each having side ends, the panels being connected to each other with at least one of the panel side ends being left open to form the at least one wire exit opening in the body; and (b) a furniture attachment system adapted for interconnection between the body and the furniture or equipment;

wherein the body includes at least two straps attached to and extending between the open panel side ends.

9. A wire management bag for use in storing electrical wires that accompany electronic equipment, the bag being adapted for attaching to a piece of furniture or to the electronic equipment, the bag comprising:

(a) a body having an open top and at least one wire exit opening in the body;

wherein the body includes front and back panels each having side ends, the panels being connected to each other with at least one of the panel side ends being left open to form the at least one wire exit opening in the body; and (b) a furniture attachment system adapted for interconnection between the body and the furniture or equipment;

wherein the furniture attachment system includes first and second hanging straps, one end of each hanging strap being attached to the body and the other end of each hanging strap including at least one of a ring and a hook which may be used to hang the bag.

10. A wire management bag for use in storing electrical wires that accompany electronic equipment, the bag being adapted for attaching to a piece of furniture or to the electronic equipment, the bag comprising:

(a) a body having an open top and at least one wire exit opening in the body;

wherein the body includes front and back panels each having side ends, the panels being connected to each other with at least one of the panel side ends being left open to form the at least one wire exit opening in the body; and (b) a furniture attachment system adapted for interconnection between the body and the furniture or equipment;

wherein the body includes at least one partition therein to divide the body into separate and compartments and allow separation and organization of different types of wires.

11. A wire management bag for use in storing electrical wires that accompany electronic equipment, the bag being adapted for attaching to a piece of furniture or to the electronic equipment, the bag comprising:

(a) a body having an open top and at least one wire exit opening in the body;

wherein the body includes front and back panels each having side ends, the panels being connected to each other with at least one of the panel side ends being left open to form the at least one wire exit opening in the body; and (b) a furniture attachment system adapted for interconnection between the body and the furniture or equipment.

wherein the body further includes at least one heat dissipating vent opening separate and distinct from the open top and the wire exit opening.

12. In an installation of electronic equipment having electrical wiring extending therefrom and an equipment holding member for supporting the electronic equipment, the improvement comprising a wire management bag including a top side, a bottom side, and opposite end sides, said bag being formed by a front panel and a back panel, said bottom side of said bag being closed, at least one of the other sides of said bag being open for permitting insertion of the wiring into the body through said opening, said bag having an additional wire exit location for egress of wires from the bag, and means for hanging the bag from one of the electronic equipment and the equipment holding member;

the hanging means including first and second straps, one end of each strap being attached to the body and the other end of each strap including at least one of a hook and a ring which may be used to hang the bag.

13. A wire management bag for attaching to a piece of furniture or to a piece of electronic equipment, the bag comprising:

(a) a body having an open top into which wires may be placed; a closure mechanism including a portfolio-type hinge mechanism for retaining the wires in the bag, the closure mechanism having rigid strips joined together in a spring biased relation; a front panel having opposite ends, a back panel having opposite ends adjacent to the opposite ends of the front panel, respectively, and at least two straps attached to and extending between adjacent ends of the front and back panels and defining an end opening for egress of wires from the body; at least one heat dissipating vent opening separate and distinct from the open top and the wire egress end opening; arid at least one partition therein to divide the body into separate compartments and allow separation and organization of different types of wires; and (b) a furniture attachment system having first and second straps, one end of each strap being attached to the body and the other end of each strap including at least one of a hook and a ring which may be used to hang the bag.

14. A wire management bag for use in storing electrical wires that accompany electronic equipment, the bag being adapted for attaching to a piece of furniture or to the electronic equipment, the bag comprising: (a) a body having an open top and at least one wire exit opening in the body;

wherein the body includes front and back panels each having side ends, the panels being connected to each other with at least one of the panel side ends being left open to form the at least one wire exit opening in the body; and (b) a furniture attachment system adapted for interconnection between the body and the furniture or equipment;

wherein the body further includes at least one strap attached to and extending between the open panel side ends, thereby dividing the exit opening into at least two openings.

15. A wire management bag for use in storing electrical wiring that accompanies electronic equipment, the bag being adapted for attaching to a piece of furniture or to the electronic equipment, the bag comprising a body having an open to, and a number of wire exit openings in the body, the bag further including a furniture attachment system for attaching the body to the piece of furniture or the piece of electronic equipment, whereby the electronic wiring is placed in the body via its open top and those wiring requiring egress therefrom may be exited from the body via the at least one wire exit opening;

wherein the body includes a front panel having opposite ends, a back panel having opposite ends adjacent to the opposite ends of the front panel, respectively, and at least two straps attached to and extending between adjacent ends of the front and back panels to define the number of wire exit openings for exit of wires from the body.

wherein the body further includes a closure mechanism for the open top to retain the wires in the bag.

16. A wire management bag according to claim 15, wherein the closure mechanism includes a portfolio-type mechanism having rigid strips joined together in a spring biased relation.

17. A wire management bag for use in storing electrical wiring that accompanies electronic equipment, the bag being adapted for attaching to a piece of furniture or to the electronic equipment, the bag comprising a body having an open top and a number of wire exit openings in the body, the bag further including a furniture attachment system for attaching the body to the piece of furniture or the piece of electronic equipment, whereby the electronic wiring is placed in the body via its open too and those wirings requiring egress therefrom may be exited from the body via the at least one wire exit opening;

wherein the body includes a front panel having opposite ends, a back panel having opposite ends adjacent to the opposite ends of the front panel respectively, and at least two straps attached to and extending between adjacent ends of the front and back panels to define the number of wire exit openings for exit of wires from the body;

wherein the furniture attachment system includes first and second hanging straps, one end of each hanging strap being attached to the body and the other end of each hanging strap including a ring which may be used to hang the bag.

18. A wire management bag for use in storing electrical wiring that accompanies electronic equipment the bag being adapted for attaching to a piece of furniture or to the electronic equipment, the bag comprising a body having an open top and a number of wire exit openings in the body, the bag further including a furniture attachment system for attaching the body to the piece of furniture or the piece of electronic equipment, whereby the electronic wiring is placed in the body via its open top and those wirings requiring egress therefrom may be exited from the body via the at least one wire exit opening:

wherein the body includes a front panel having opposite ends, a back panel having opposite ends adjacent to the opposite ends of the front panel, respectively, and at least two straps attached to and extending between adjacent ends of the front and back panels to define the number of wire exit openings for exit of wires from the body;

wherein the body includes at least one partition therein to divide the body into separate compartments and allow separation and organization of different types of wires.

19. A method of organizing the electrical wiring extending from an electronic device supported on equipment holding furniture, the method of which comprises inserting the wiring into a generally flat wire management bag through a first opening in the bag, egressing at least one wire through one of the first opening and a second opening of the wire management bag; and locating the bag adjacent to the wiring extending from the electronic device by connecting the bag to at least one of the electronic device and the equipment holding furniture; wherein the locating of the wire management bag is accomplished in a manner that places the bag in an upright plane;

wherein inserting the wiring into the bag includes inserting the wiring through a portfolio-type hinge mechanism formed in the bag, the mechanism having rigid strips joined together in a spring biased relation.

20. The method according to claim 19, further comprising venting heat from the wire management bag through one or more vent holes formed in the body of the bag.

21. The method according to claim 19, wherein egressing the at least one wire includes egressing at least one wire through a second opening formed in an open side edge of the bag.

22. The method according to claim 19, wherein the step of inserting the wiring into the wire management bag includes separating various types of wiring and placing each type of wiring into compartments formed in the bag.

* * * * *

UNITED STATES PATENT AND TRADEMARK OFFICE
CERTIFICATE OF CORRECTION

PATENT NO. : 5,779,366
DATED : July 14, 1998
INVENTOR(S) : C.K. McKenzie, III et al.

It is certified that error appears in the above-identified patent and that said Letters Patent is hereby corrected as shown below:

| COLUMN | LINE | |
|---|---|---|
| 7 (Claim 10, | 50 line 16) | after "separate" delete "and" |
| 8 (Claim 13, | 35 line 16) | "arid" should read --and-- |
| 8 (Claim 14, | 45 line 4) | before "(a)" insert a new paragraph |
| 8 (Claim 15, | 64 line 5) | "to," should read --top-- |
| 9 (Claim 15, | 1 line 9) | "wiring" should read --wirings-- |

UNITED STATES PATENT AND TRADEMARK OFFICE
CERTIFICATE OF CORRECTION

| PATENT NO. | : | 5,779,366 |
|---|---|---|
| DATED | : | July 14, 1998 |
| INVENTOR(S) | : | C.K. McKenzie, III et al. |

It is certified that error appears in the above-identified patent and that said Letters Patent is hereby corrected as shown below:

| COLUMN | LINE | |
|---|---|---|
| 9 (Claim 17, | 25 line 9) | "too" should read --top-- |
| 9 (Claim 17, | 30 line 14) | after "panel" insert --,-- |
| 10 (Claim 19, | 20 line 5) | "bag," should read --bag;-- |

Signed and Sealed this

Eighth Day of December, 1998

Attest:

BRUCE LEHMAN

Attesting Officer

Commissioner of Patents and Trademarks